(12) United States Patent
Abel et al.

(10) Patent No.: US 11,562,221 B2
(45) Date of Patent: Jan. 24, 2023

(54) OPTICAL SYNAPSES

(71) Applicant: International Business Machines Corporation, Armonk, NY (US)

(72) Inventors: Stefan Abel, Zurich (CH); Bert Jan Offrein, Schoenenberg (CH); Antonio La Porta, Kilchberg (CH); Pascal Stark, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 474 days.

(21) Appl. No.: 16/830,333

(22) Filed: Mar. 26, 2020

(65) Prior Publication Data

US 2021/0303983 A1   Sep. 30, 2021

(51) Int. Cl.
| | |
|---|---|
| *G11C 16/10* | (2006.01) |
| *G06N 3/067* | (2006.01) |
| *G02F 1/19* | (2019.01) |
| *G11C 11/42* | (2006.01) |
| *G11C 11/54* | (2006.01) |

(52) U.S. Cl.
CPC ............. *G06N 3/0675* (2013.01); *G02F 1/19* (2013.01); *G11C 11/42* (2013.01); *G11C 11/54* (2013.01)

(58) Field of Classification Search
CPC ......... G06N 3/0675; G02F 1/19; G11C 11/42; G11C 11/54; G11C 7/1054; G11C 13/0004; G11C 13/0007; G11C 13/0011; G11C 13/0014; G11C 13/0069
See application file for complete search history.

(56) References Cited

U.S. PATENT DOCUMENTS

| | | | |
|---|---|---|---|
| 9,767,408 B1 | 9/2017 | Kara et al. | |
| 2010/0278479 A1* | 11/2010 | Bratkovski | ........ G02B 6/12007 |
| | | | 359/315 |
| 2017/0116514 A1 | 4/2017 | Abel et al. | |
| 2017/0116515 A1 | 4/2017 | Abel et al. | |
| 2018/0267386 A1 | 9/2018 | Rios et al. | |
| 2018/0277756 A1 | 9/2018 | Li et al. | |
| 2019/0019081 A1 | 1/2019 | Kim | |

(Continued)

FOREIGN PATENT DOCUMENTS

| | | |
|---|---|---|
| CN | 107611260 A | 1/2018 |
| CN | 107634140 A | 1/2018 |
| CN | 109065713 A | 12/2018 |

OTHER PUBLICATIONS

Written Opinion and International Search Report, PCT/IB2021/051229, dated May 20, 2021, 7 pages.

(Continued)

*Primary Examiner* — Xiaochun L Chen
(74) *Attorney, Agent, or Firm* — Timothy J. Singleton (57) ABSTRACT

An optical synapse comprises a memristive device for non-volatile storage of a synaptic weight dependent on resistance of the device, and an optical modulator for volatile modulation of optical transmission in a waveguide. The memristive device and optical modulator are connected in control circuitry which is operable, in a write mode, to supply a programming signal to the memristive device to program the synaptic weight and, in a read mode, to supply an electrical signal, dependent on the synaptic weight, to the optical modulator whereby the optical transmission is controlled in a volatile manner in dependence on programmed synaptic weight.

25 Claims, 5 Drawing Sheets

(56) References Cited

U.S. PATENT DOCUMENTS

2019/0065929 A1   2/2019  Koelmans et al.
2020/0019851 A1*  1/2020  Mehrabian ............. G06N 3/067
2021/0242397 A1*  8/2021  Kemp ................. H01L 27/2463

OTHER PUBLICATIONS

Abel et al., "Multi-Level Optical Weights in Integrated Circuits", 2017 IEEE International Conference on Rebooting Computing (ICRC), 2017, 3 pages.

Abel et al., "Large Pockels effect in micro- and nanostructured barium titanate integrated on silicon", Nature Materials, vol. 18, Published: Nov. 12, 2018, 7 pages.

* cited by examiner

OPTICAL SYNAPSES

BACKGROUND

The present disclosure relates generally to optical synapses, and more particularly to optical synapses for modulating optical transmission in neuromorphic networks.

Neuromorphic networks perform computational tasks in a manner inspired by biological architectures of the nervous system. In the human brain, information is processed by a complex network of neurons interconnected via synapses. A biological neuron receives input signals from other neurons, and generates output signals ("action signals" or "spikes") when the neuron state (or "membrane potential") traverses a threshold level. These spikes are conveyed to other neurons via synapses which change their connection strength ("plasticity" or "synaptic weight") as a result of neuronal activity. Neuromorphic networks emulate this biological functionality via a succession of network layers comprising nodes, corresponding to neurons, which are interconnected via synapses that relay weighted signals between connected nodes in adjacent layers in dependence on stored synaptic weights.

Neuromorphic networks can be exploited in numerous applications in science and technology, including computer vision, speech recognition, audio/video analysis, medical diagnosis, genetic analysis, and pharmaceutical drug design. A network is configured for a given application by programming the synaptic weights. The weights can be programmed via an iterative training process in which the network is exposed to a set of training data for the application, and the weights are progressively updated as the network "learns" from the training data. The trained network, with fixed weights defined by the training operation, can then be applied for inference based on new (unseen) data for the application in question.

In electronic implementations of neuromorphic networks, information is encoded in electrical signals and synapses modulate voltage/current levels based on stored synaptic weights. In optical implementations, information is encoded in the optical power and/or phase of photonic signals transmitted over waveguides. Synaptic functionality is implemented by optical synapses which modulate optical transmission in the waveguides based on stored synaptic weights. A synaptic weight can be programmed via programming signals supplied to the synapse in a programming (or "write") mode of operation, e.g. during network training. The programmed weights can then be applied to modulate transmission in the network in a "read" mode of operation, e.g. during inference.

There are numerous implementations of synapses in the electronic domain, including circuits which exploit memristive properties of nanodevices based on resistive memory cells. These devices exploit various physical mechanisms (e.g. resistance characteristics of phase-change memory (PCM) materials and filamentary, electrochemical or ferroelectric switching in oxide materials) for non-volatile storage of synaptic weights which depend on programmable resistance of the devices. Dense cross-bar arrays of such memristive devices offer massively parallel and highly area- and energy-efficient neural networks which can be efficiently implemented in integrated circuits. There have been few proposals for synapse implementation in the optical domain however. Two examples of optical synapses are described in US Patent Application Publications No. 2018/0267386 A1 which discloses synapses with "direct" optical weights (i.e., the weights are stored in a non-volatile manner in the optical domain) based on PCM materials.

Improved implementations for optical synapses would be highly desirable.

SUMMARY

One aspect of the present disclosure provides an optical synapse comprising a memristive device for non-volatile storage of a synaptic weight dependent on resistance of the device, and an optical modulator for volatile modulation of optical transmission in a waveguide. The memristive device and optical modulator are connected in control circuitry which is operable, in a write mode, to supply a programming signal to the memristive device to program the synaptic weight and, in a read mode, to supply an electrical signal, dependent on the synaptic weight, to the optical modulator whereby the optical transmission is controlled in a volatile manner in dependence on programmed synaptic weight.

Optical synapses embodying the disclosure exploit indirect optical weights. The synaptic weight is stored solely in the electronic domain by programming non-volatile resistance of the memristive device. Modulation is performed in a volatile manner in the optical domain based on a weight-dependent electrical signal supplied to an optical modulator. This coupling of a non-volatile memristive device and a volatile optical modulator offers extremely efficient photonic synapses in which optical properties of the synapse can be tuned independently of electrical properties of the non-volatile device. The optical modulator can be engineered for an optimal optical response and the memristive device can be engineered for optimal weight-storage characteristics, thus enhancing synaptic performance. Synapses embodying the disclosure can be readily fabricated as integrated photonic structures. The improved synaptic efficiency offers high-performance, energy-efficient integrated structures for optical neural networks. In addition, use of two coupled systems for weight-storage and optical modulation allows the independent systems to be tuned dynamically to implement various synaptic plasticity effects. These and other advantages are explained in more detail below.

The control circuitry of preferred embodiments includes decoupling circuitry for electrically decoupling the optical modulator from the memristive device in the write mode. This decoupling protects the optical modulator from programming signals applied to the memristive device. The memristive device is also advantageously connected in a voltage divider such that the electrical signal supplied to the optical modulator in the read mode is dependent on an output signal of the voltage divider. This allows voltage splitting between the memristive device and optical modulator to be tuned to an optimal operating range of the modulator in the read mode.

The optical modulator may be absorptive or refractive. Particularly efficient implementations below use refractive optical modulators, some exploiting an electro-optic effect and others a thermo-optic effect. In particular, the optical modulator may comprise an electro-optic modulator and the electrical signal supplied in the read mode may comprise a drive voltage for the electro-optic modulator. In preferred embodiments, the electro-optic modulator exploits ferroelectric materials to implement an optical phase shifter. The optical phase shifter comprises a ferroelectric material, optically coupled to the waveguide, disposed between a pair of electrodes for applying the electrical signal in the read mode. Here, including the above-mentioned decoupling circuitry in the control circuitry inhibits ferroelectric domain switching in the ferroelectric material in the write mode.

In other embodiments, the optical modulator comprises a thermo-optic modulator and the electrical signal applied in the read mode comprises a drive current for a heater of the thermo-optic modulator. The thermo-optic modulator can be implemented using an optical phase shifter in which the heater comprises a metal layer, in thermal contact with the waveguide, disposed between a pair of contacts for applying the electrical signal.

Electro-optic and thermo-optic modulators can be efficiently integrated with memristive devices in monolithic integrated circuits to provide integrated optical synapses embodying the disclosure.

Synapses embodying the disclosure can be adapted to implement various synaptic plasticity effects by controlling one or both of the volatile and non-volatile subsystems. In particular, because the optical modulator is volatile, this subsystem can be controlled to emulate short-term plasticity (STP) characteristics of biological synapses. The control circuitry here can include synapse control logic which is responsive to synaptic control signals. The synapse control logic is operable to vary, in dependence on the synaptic control signals, the electrical signals supplied to the optical modulator in the read mode to implement a desired short-term plasticity effect. The non-volatile subsystem can be independently controlled to implement various long-term plasticity (LTP) effects. In particular, the synapse control logic can be further operable to vary the programming signals supplied to the optical modulator in the write mode to implement a desired long-term plasticity (LTP) effect. The synaptic control signals and the emulation of STP/LTP characteristics are explained in more detail below.

A further aspect of the disclosure provides a neuromorphic network comprising a plurality of nodes in which pairs of nodes are interconnected via respective waveguides for transmission of optical signals between nodes of each pair, wherein each waveguide includes an optical synapse as described above.

Embodiments of the disclosure will be described in more detail below, by way of illustrative and non-limiting example, with reference to the accompanying drawings.

DETAILED DESCRIPTION

Figure 1:
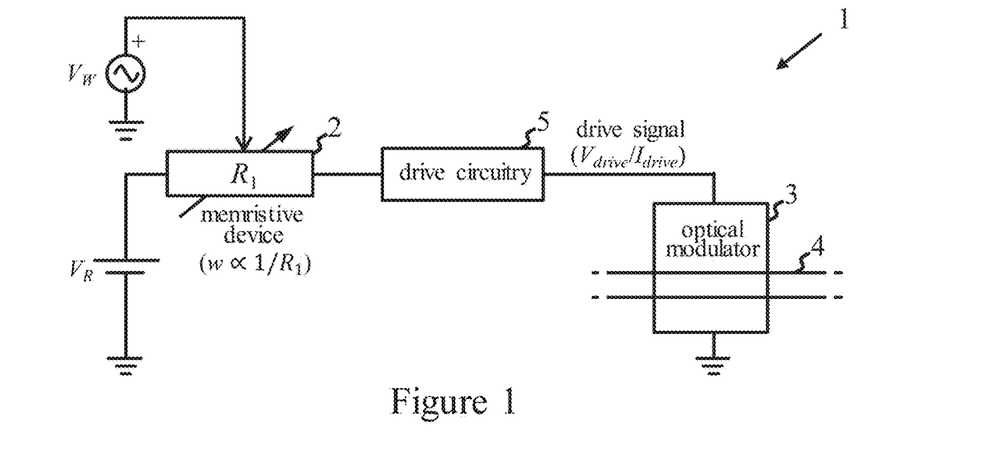
FIG. 1 is a schematic circuit representation of an optical synapse embodying the disclosure.

The schematic of FIG. 1 indicates basic structure of an optical synapse embodying the disclosure. The synapse 1 comprises a memristive device 2, represented as variable resistance $R_1$, and an optical modulator indicated schematically at 3. The memristive device 2 is adapted for non-volatile storage of a synaptic weight w which depends on resistance $R_1$ of the device. In particular, the synaptic weight w corresponds to conductance of device 2 and hence varies inversely with resistance $R_1$. The optical modulator 3 is adapted for volatile modulation of optical transmission in a waveguide 4. Memristive device 2 and optical modulator 3 are connected in control circuitry comprising drive circuitry 5, connected between device 2 and modulator 3, and supply circuitry for supplying signals to device 2 in operation. In particular, in a programming or "write" mode of operation, a programming signal, here a pulsed voltage signal $V_W$, can be applied to the memristive device to program the resistance $R_1$ and hence synaptic weight w. In a "read" mode of operation, a read voltage $V_R$ is applied to memristive device 2 and an output signal, dependent on resistance $R_1$ and hence synaptic weight w, of device 2 is applied to drive circuitry 5. The drive circuitry 5 in turn supplies an electrical drive signal, dependent on the weight-dependent output from device 2, to the optical modulator 3 which modulates transmission in waveguide 4 accordingly. Optical transmission in the waveguide is thus controlled in a volatile manner in dependence on the programmed synaptic weight w.

The synapse of FIG. 1 provides a non-volatile optical synapse in which synaptic weight w is stored solely in the electronic domain and weight-dependent modulation is performed in a volatile manner in the optical domain. The drive signal supplied to modulator 3 may be a voltage signal $V_{drive}$ or a current signal $I_{drive}$. The non-volatile optical state W of the synapse can be expressed as $W=f(V_{drive})$ or $W=g(I_{drive})$, where: $f$ and $g$ are functions of the optical device; and $V_{drive}$ and $I_{drive}$ are functions of the non-volatile electrical state of memristive device 2. The electrical and optical subsystems of the synapse can be engineered independently for optimum characteristics. Optical contrast in modulator 3 can be optimized independently of the non-violative electrical subsystem, and device 2 can be adapted for optimal weight-storage characteristics independently of the volatile optical subsystem.

Figure 2:
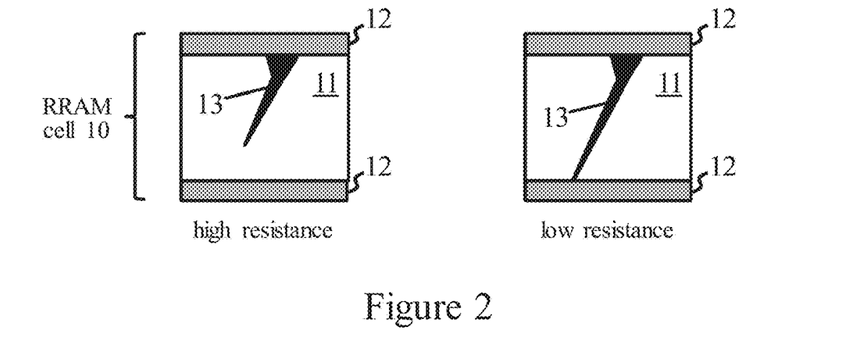
FIG. 2 shows an exemplary implementation of a memristive device in the FIG. 1 circuit.

The programmable resistance of memristive device 2 may exploit a variety of physical mechanisms well-known in the art, including filamentary switching, electrochemical switching, ferroelectric switching and resistance properties of PCM materials. Device 2 may comprise one or more resistive memory elements, or cells, such as PCM cells and resistive RAM (RRAM) cells, including oxide/metal-oxide RRAM cells, conductive bridge RRAM cells and carbon RRAM cells. The basic operating principle of such cells relies on the reversible, non-volatile change in resistance characteristics of one or more material layers disposed between two electrodes. The overall resistance, and hence conductivity of the cell, can be varied by application of programming pulses via the electrodes. By way of example, FIG. 2 illustrates conductive filament formation in a filamentary RRAM cell. The cell 10 comprises a high-resistance oxide layer 11, e.g. $HfO_2$, between a pair of electrodes 12. Application of programming pulses via electrodes 12 causes progressive formation of conductive filaments 13 in the high-resistance layer 11. The left-hand diagram shows a high-resistance cell-state. With successive programming pulses, the length of the filaments increases, reducing effective resistance of the oxide layer between the electrodes. A low-resistance state is shown in the right-hand diagram where the filaments have bridged the oxide layer. Resistance of the cell can be "read" by applying a low read voltage across the electrodes whereby the resulting current through the cell depends on the programmed resistance.

Numerous physical mechanisms, including migration of metal ions, oxygen ions, metal precipitates or graphene clusters through various material layers, as well as Joule heating of PCM materials, may be employed in resistive memory elements. One or more cells can be arranged in a variety of known circuit configurations to provide desired programmable resistance characteristics. In general, therefore, memristive device 2 may comprise one or more resistive memory cells of any desired type, and device properties can be readily tuned to give desired weight-storage characteristics.

Figure 3:
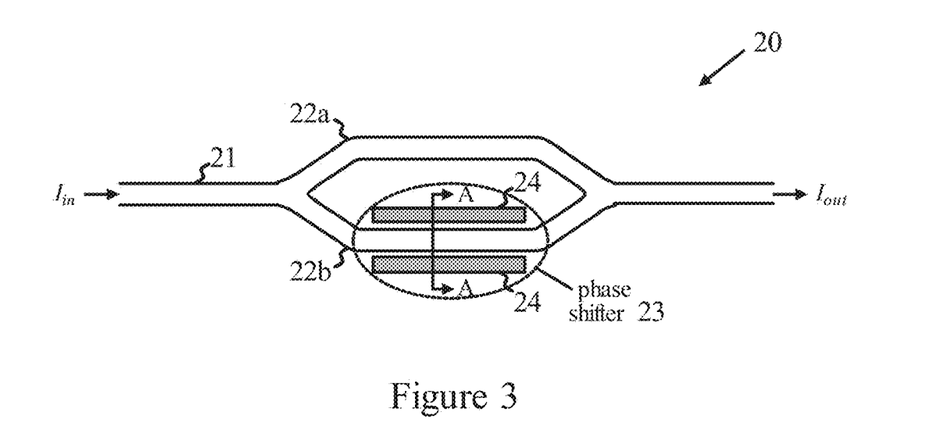
FIG. 3 shows an exemplary implementation of an optical modulator in the FIG. 1 circuit.

Optical modulator 3 may be an absorptive or refractive modulator whereby optical transmission in waveguide 4 is modulated via volatile variation of an absorption coefficient or refractive index (i.e. the real part of the complex refractive index) of the waveguide. Preferred embodiments exploit refractive optical modulators. These can be efficiently implemented with optical phase shifters which vary the phase of light in a portion of the waveguide by refractive index variation controlled by the electrical drive signal $V_{drive}$ or $I_{drive}$. The resulting phase modulation can be converted to amplitude modulation, for example by an interferometer. FIG. 3 shows an embodiment of such an optical modulator 20 based on a Mach Zehnder interferometer (MZI). Waveguide 21 splits into two arms 22a, 22b and an optical phase shifter, indicated schematically at 23, is provided in one of the arms 22b. Phase shifter 23 comprises a pair of electrodes 24 which vary the effective refractive index of at least one material in waveguide arm 22b, in response to drive signal $V_{drive}$ or $I_{drive}$, via a mechanism explained below. The change of the refractive index results in a change of the propagation index $n_b$ of the optical mode in the waveguide. For a lossless balanced MZI (with waveguide arms 22a, 22b of length l and absorption coefficient α=0), the difference in effective propagation indices $n_a$, $n_b$ of arms 22a, 22b affects intensity of light transmitted by waveguide 21 according to:

$$I_{out} = I_{in}[1+\cos(2\pi l(n_a-n_b)/\lambda)]/2$$

where $I_{in}$ and $I_{out}$ are the optical input and output intensity respectively, and λ is the wavelength of the transmitted light.

Figure 4A:
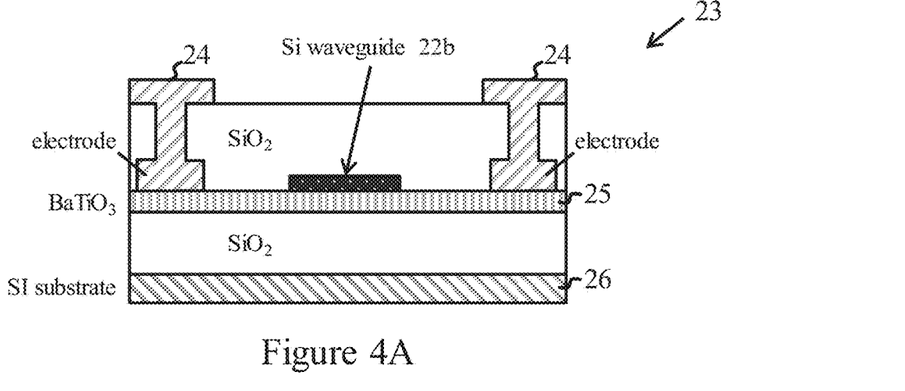
FIGS. 4A and 4B illustrate structure and operation of one embodiment of an optical phase shifter in the FIG. 3 modulator.

Refractive index modulation in phase shifter 23 may exploit an electro-optic or thermo-optic effect. FIG. 4A illustrates the structure of phase shifter 23 in an electro-optic modulator of synapses embodying the disclosure. This figure shows a schematic cross-section on line A-A of FIG. 3. The phase shifter comprises a ferroelectric material, here a layer 25 of barium titanate BaTiO$_3$ ("BTO"), which is optically coupled to arm 22b of a silicon waveguide formed on BTO layer 25. This structure implements a hybrid BTO/Si waveguide in arm 22b of modulator 20. BTO layer 25 is disposed between the electrodes 24 which apply a drive voltage $V_{drive}$ across the hybrid waveguide structure. The hybrid waveguide is embedded in oxide material, here SiO$_2$, formed on a silicon substrate 26.

Ferroelectric materials such as BTO exhibit a change in refractive index n in the presence of an applied electric field E according to:

$$n(E) = n - rn^3E/2 - \xi n^3E^2/2$$

where the term $rn^3E/2$ denotes the electro-optic (Pockels) effect with Pockels coefficient r, and the term $\xi n^3E^2/2$ denotes the Kerr effect with Kerr constant ξ. The Pockels effect dominates in such materials, and refractive index variation in the presence of a static bias voltage $V_{drive}$ can be expressed as:

$$n(v_{drive}) = n + \frac{dn}{dv}V_{drive}$$

where $$\frac{dn}{dv}$$

results from me Pockels effect. By way of example, for a static field and 45° waveguide orientation relative to the main crystalline axes of BTO, $$\frac{dn}{dv} \approx -0.2 \times 10^{-3} V^{-1}.$$

Figure 4B:
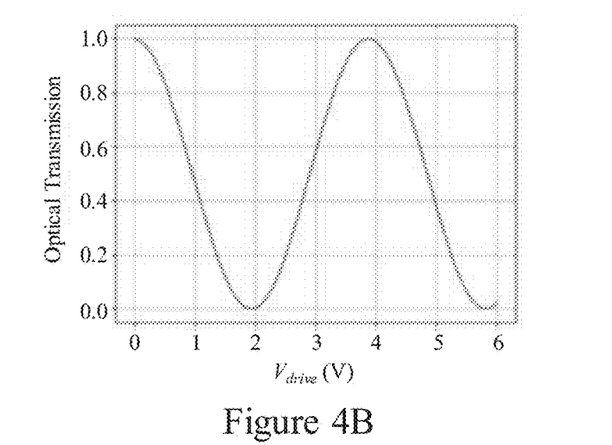

FIG. 4B indicates variation of output intensity as a function of $V_{drive}$ in a 2 mm long, lossless MZI 20 using the FIG. 4A phase-shifter with an electrode spacing of 4.75 μm.

Figure 5:
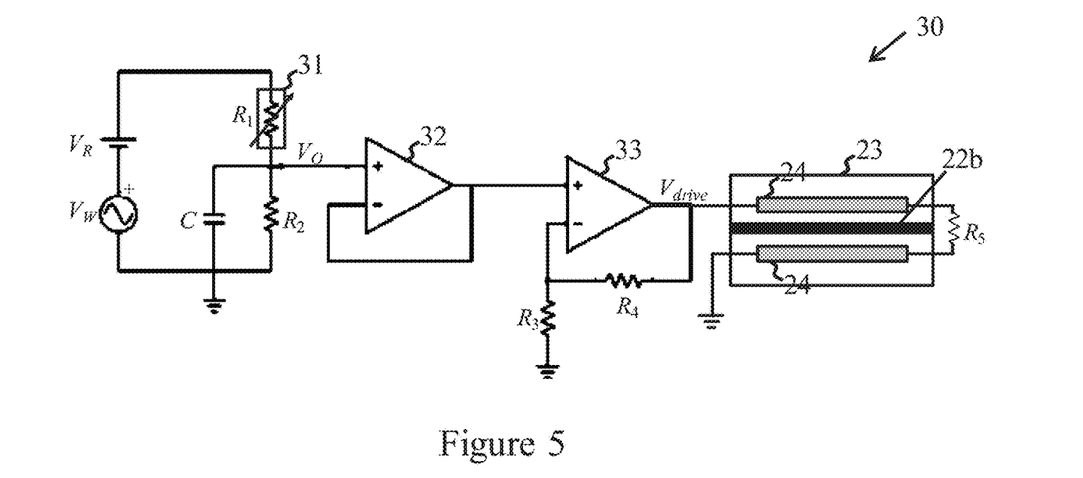
FIG. 5 shows a more detailed circuit diagram for an optical synapse with the phase shifter of FIG. 4A.

FIG. 5 shows a more detailed circuit configuration for a preferred embodiment of the optical synapse. The synapse 30 comprises memristive device 31, again represented by variable resistance $R_1$, and an optical modulator employing phase shifter 23 described above. Memristive device 31 is connected in a voltage divider configuration with resistor $R_2$. An output $V_O = V_R \cdot R_2/(R_1+R_2)$ of the voltage divider is supplied to the subsequent drive circuitry for generating the modulator drive signal $V_{drive}$ in response to DC bias $V_R$ in the read mode. The control circuitry of this embodiment also includes decoupling circuitry to electrically decouple the optical modulator from memristive device 31 in the write mode. The decoupling circuitry comprise a capacitor C and an operational amplifier (op amp) voltage follower 32. Capacitor C is connected in series with memristive device 31 to provide a short circuit for the voltage pulse train $V_W$ applied in the write mode for programming memristive device 31. Op amp 32 (gain $A_1=1$) provides a voltage buffer and additional decoupling for the modulator drive circuit. A second op amp 33 provides voltage amplification with gain $A_2=1+R_4/R_3$. Resistor $R_5$ here represents the impedance load presented by the optical phase shifter 23.

By way of example, memristive device 31 may be implemented by an RRAM memory cell with a resistance range of 10 kΩ to 100 kΩ. Programming of device resistance $R_1$ in this range can be effected by a pulse generator generating different numbers p of programming pulses, e.g. 10 ns pulses of amplitude in the range 2V to 4V, in a pulse train $V_W$ in the write mode. The read voltage $V_R$ is set to a sufficiently low level, e.g. 0.2V, to avoid changing the programmed state of device 31 in the read mode. With this configuration, $V_O$=0.07V to 0.17V in the read mode, and $V_{drive}=A_1 \cdot A_2 \cdot V_O$=1.82V to 4.42V with $R_3$=1 kΩ and $R_4$=25 kΩ.

The voltage divider of the synapse control circuitry allows the memristive device output to be tuned to the desired operating range of the optical phase shifter for the read operation. The decoupling circuitry in synapse 30 inhibits transfer of programming pulses to optical phase shifter 23, protecting the modulator from potentially adverse effects of these pulses. In particular, a potential problem with use of ferroelectric Pockels materials in phase shifter 23 is that the high-voltage pulses $V_W$ can cause polarization flipping in the ferroelectric domains of these materials, causing a non-volatile change in refractive index. To inhibit this ferroelectric domain switching, the applied bias voltage must stay either positive or negative, and the programming pulses must be decoupled from the phase-shifter electrodes. The control circuitry of FIG. 5 thus provides a volatile optical modulator implementation using ferroelectric Pockels materials.

Figure 6A:
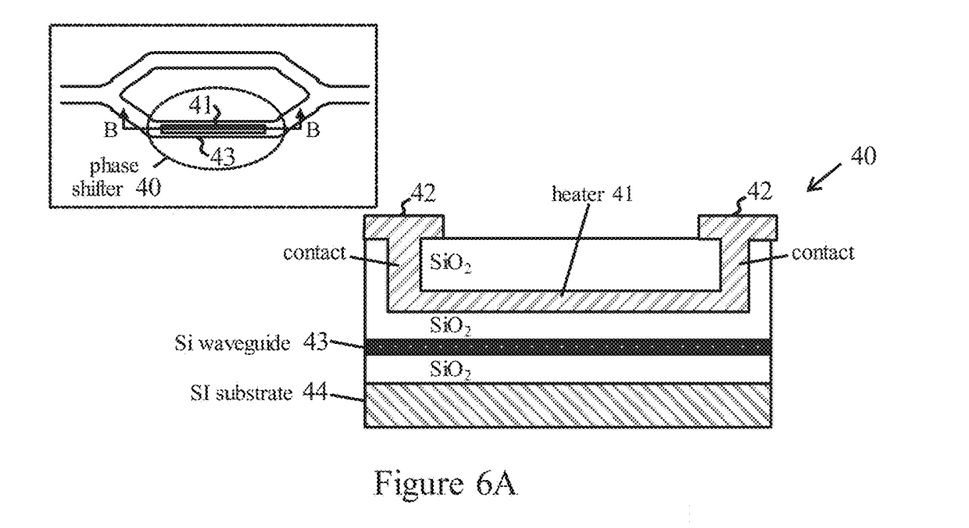
FIGS. 6A and 6B illustrate structure and operation of another embodiment of an optical phase shifter.

FIG. 6A illustrates an alternative phase shifter for a thermo-optic modulator in embodiments of the disclosure. This figure shows a schematic cross-section of the MZI structure corresponding to line A-A in the inset Figure. This phase shifter 40 comprises a metal layer as heater 41, disposed between electrodes 42, which is heated by application of a drive current $I_{drive}$ via the contacts by Joule heating. Heater 41 may be formed, for example, of tungsten, aluminum, copper, titanium or carbon. The heater 41 is in thermal contact with a waveguide 43, here of silicon, in which application of heat induces a refractive index change via the thermo-optic effect. The structure is embedded in oxide material, here $SiO_2$, formed on a silicon substrate 44.

Application of drive current $I_{drive}$ to heater 41 causes a change ΔT in temperature T of waveguide 43 and a consequent change in refractive index n of the silicon. The change ΔT in waveguide temperature increases with temperature change $\Delta T_H$ of the heater, where $\Delta T_H \propto (I_{drive})^2 R_H$, with $R_H$ being resistance of the heater (which may itself be temperature dependent). The resulting refractive index of the silicon waveguide can be approximated as:

$$n(I_{drive}) = n + \frac{dn}{dT}\Delta T$$

where $$\frac{dn}{dT}$$

is me thermo-optic coefficient. As illustration, for a silicon waveguide at room temperature and with wavelength $$\lambda = 1.55 \, \mu m, \frac{dn}{dT} = 1.87 \times 10^{-4} K^{-1}.$$

Figure 6B:
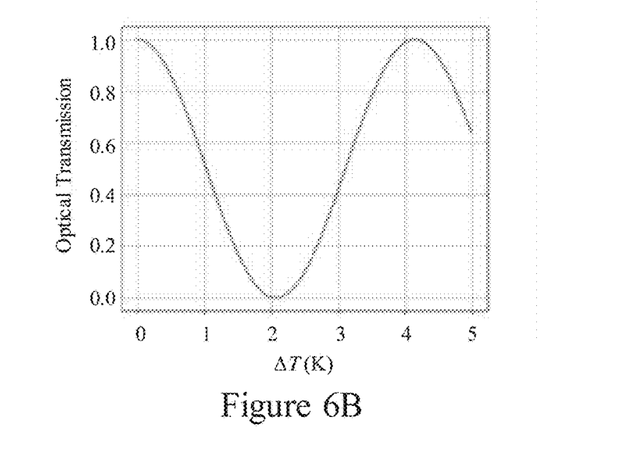

FIG. 6B indicates variation of output intensity as a function of waveguide temperature for a 2 mm long, lossless MZI 20 with the FIG. 6A phase-shifter.

An optical synapse using the FIG. 6A phase shifter can be implemented using the control circuitry FIG. 5, with op amp 33 selected to drive the current signal $I_{drive}$ in a few mA range level. The decoupling circuitry in this embodiment inhibits heating of the phase-shifter structure in response to programming pulses in the write mode.

Figure 7:
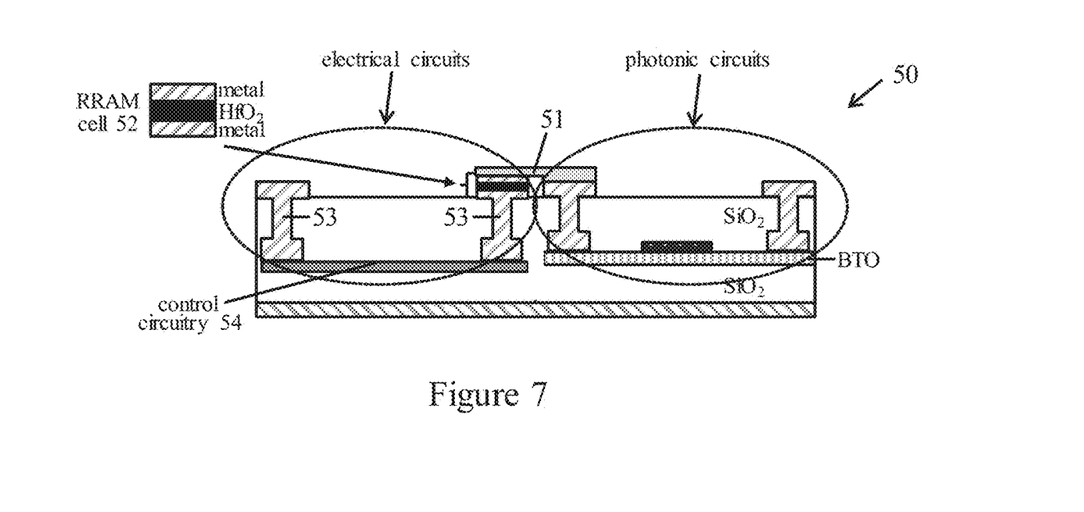
FIG. 7 illustrates structure of an integrated optical synapse embodying the disclosure.

The memristive device and optical modulator can be readily integrated with the synapse control circuitry in a monolithic integrated circuit as indicated schematically in FIG. 7. This shows an integrated optical synapse 50 in which metal interconnects, e.g. interconnect 51, bridge the electrical and photonic circuits of the synapse. The memristive device, here an RRAM memory cell 52, is formed in one of a pair of electrical contacts 53 for control circuitry 54 of this embodiment. The optical modulator here corresponds to the structure shown in FIG. 4A.

Figure 8A:
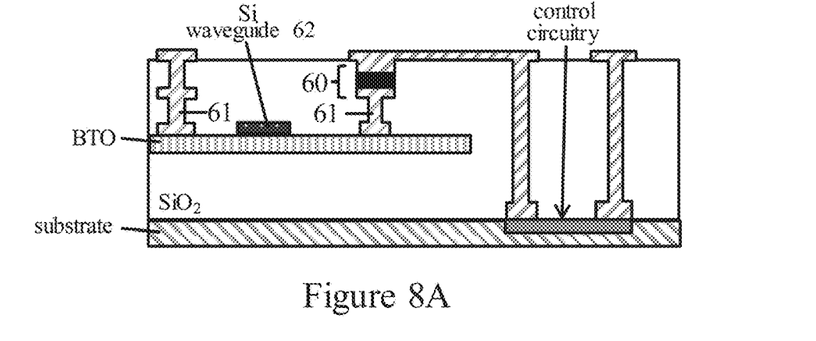
FIGS. 8A and 8B show further integrated synapse structures embodying the disclosure.
Figure 8B:
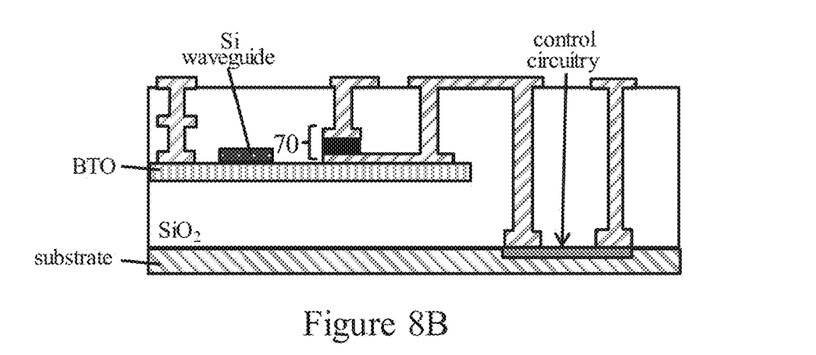

FIG. 8A illustrates an alternative structure for the integrated synapse in which the memristive device 60 is formed directly on the metal stack of one of the electrodes 61 of an electro-optic phase shifter with a silicon waveguide 62. In this embodiment, the memristor can be fabricated during back-end processing of the integrated circuit structure. FIG. 8B shows a further configuration in which the memristive device 70 is directly deposited on the BTO layer of the phase shifter. Similar configurations, and in particular those of FIGS. 7 and 8A, can be used with the thermo-optic phase shifter of FIG. 6A.

The optical synapses described above can be fabricated using well-known material processing techniques. These synapses can be fabricated as integrated photonic structures for neuromorphic networks in which arrays of optical synapses implement the vector-matrix computations required for propagation of weighted signals over successive layers of the network. Control signals for programming and read mode operation may be generated by global signal generators in these structures. Such integrated synapse arrays offer extremely high-speed, low power implementations of neuromorphic networks.

While exemplary components are described above for efficient integrated synapse structures, synapses embodying the disclosure may use various other components. For example, electro-optic phase shifters may employ other ferroelectric materials, such as lithium niobate or PZT (lead zirconate titanate), and may exploit the Pockels and/or Kerr effect for refractive index modulation. Electro-optic phase-shifters can also exploit other mechanisms, such as PIN (p-type, intrinsic, n-type) diode structures, for refractive index variation. Optical modulators can also be implemented in other ways, e.g. using directional couplers and optical resonators such as ring resonators. Modulators may include additional material layers and may also vary other optical properties, e.g. optical absorption, as will be apparent to those skilled in the art. In all implementations, characteristics of the non-volatile electrical and volatile optical subsystems can be tuned independently for desired synaptic performance.

Figure 9A:
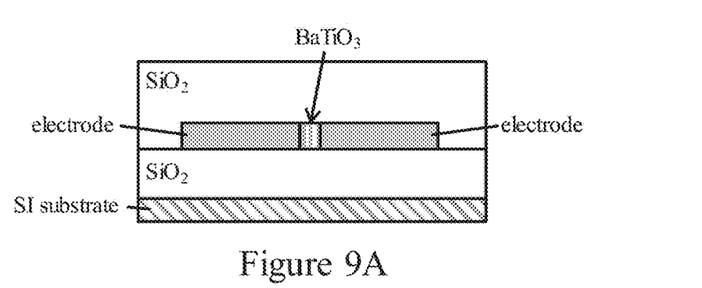
FIGS. 9A and 9B illustrate plasmonic structures for plasmonic modulators in synapses embodying the disclosure.
Figure 9B:
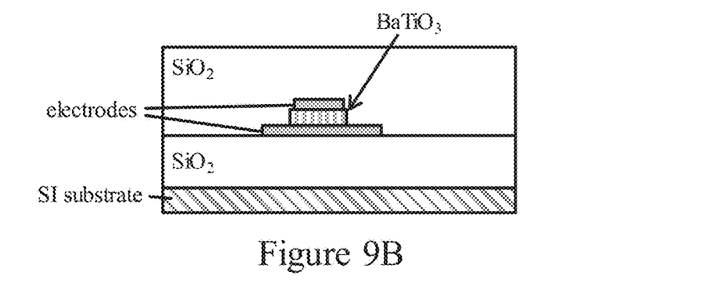

While embodiments described above use photonic modulators, plasmonic modulators may be used in other embodiments. The structures can operate at very low voltages and can be very small. FIGS. 9A and 9B show schematic cross-sections of exemplary plasmonic structures, based on BTO, which can be used for phase modulation due to Pockels effect in the BTO layer. These figures show the BTO-based plasmonic structures in cross-section transverse to the waveguide direction. Both structures comprise a layer of BTO, disposed between a pair of electrodes for application of the voltage signal $V_{drive}$, with FIG. 9A showing a horizontal slot configuration and FIG. 9B a vertical slot configuration. The plasmonic structures can be embedded in photonic circuits and optically coupled to photonic waveguides using standard photonic-to-plasmonic couplers.

Figure 10:
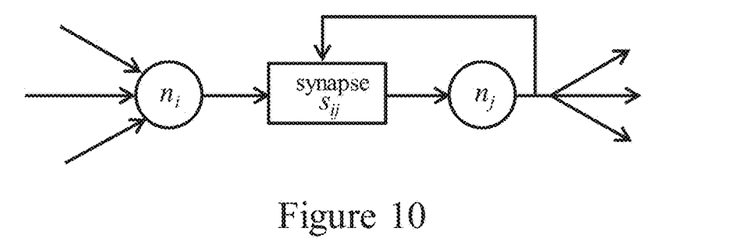
FIG. 10 is a schematic representation of a synaptic connection in a neural network.
Figure 11A:
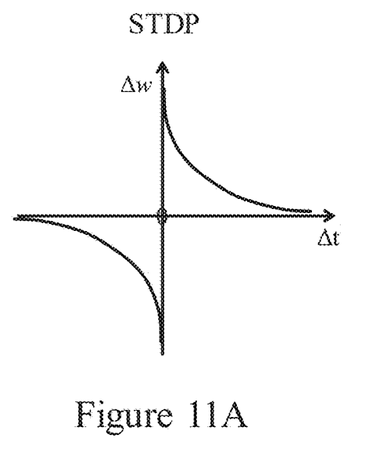
FIGS. 11A and 11B illustrate spike-timing dependent plasticity effects in the FIG. 10 system.
Figure 11B:
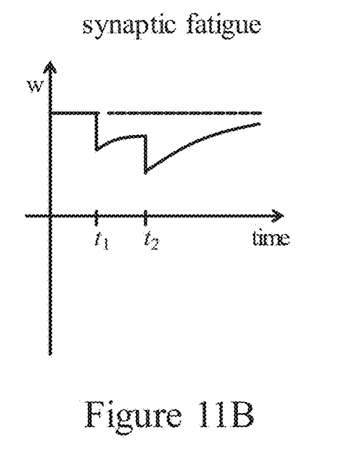

Independence of the electrical and optical subsystems may also be exploited to implement desired synaptic plasticity effects. Such effects will be explained in more detail with reference to FIGS. 10, 11A and 11B. FIG. 10 is a simple diagram of a synaptic connection between nodes of a neural network. A pre-synaptic node $n_i$ is connected via a synapse $s_{ij}$ to a post-synaptic node $n_j$. Pre-synaptic node $n_i$ receives signals from other network nodes, and generates action signals which are supplied to synapse $s_{ij}$. The synapse $s_{ij}$ relays weighted signals to the post-synaptic node $n_j$, which in turn generates action signals dependent on its weighted input signals from connected nodes in the network. Action signals from post-synaptic node $n_j$ are transmitted onward via synaptic connections to other nodes of the network. The pre- and post-synaptic nodes $n_i$, $n_j$ may generate action signals at arbitrary timings dependent on their respective input signals, and the synaptic efficacy, or weight, of synapse $s_{ij}$ can be enhanced or reduced by network activity. This "plasticity" of synapses is crucial to memory and other brain functions. For example, synaptic weight may be modified in dependence on action signals from pre-synaptic node $n_i$ and/or post-synaptic node $n_j$ as indicated by the feedback connection from node $n_1$ to synapse $s_{ij}$ in the figure. Changes in synaptic weight may depend on timing of these action signals, e.g. relative timing of pre- and post-synaptic node action signals. Changes in synaptic weight may be transient changes, known as "short-term plasticity" (STP) effects, or long-term changes, known as "long-term plasticity" (LTP) effects. FIGS. 11A and 11B show examples of LTP and STP effects respectively. FIG. 11A indicates how changes $\Delta w$ to synaptic weight w can depend on relative timing $\Delta t=(t_j-t_i)$ of action signals from nodes $n_j$ and $n_i$. The magnitude of $\Delta w$ varies inversely with $\Delta t$, and the sign of $\Delta w$ depends on which action signal occurs first. This effect is known as spike-timing dependent plasticity (STDP). FIG. 11B illustrates an example of an STP effect, known as synaptic fatigue, whereby synaptic weight w is incrementally reduced on arrival of pre-synaptic action signals at times $t_1$ and $t_2$, gradually returning to a programmed, long-term value with time following the last pre-synaptic signal. Synaptic efficacy is thus dynamically reduced in response to more frequent pre-synaptic signals.

Figure 12:
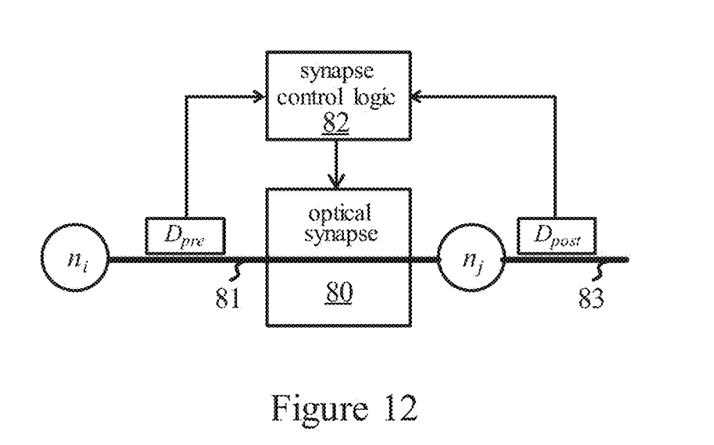
FIG. 12 illustrates implementation of tunable synaptic dynamics in optical synapses of a neuromorphic network.

Synaptic plasticity effects may be implemented in networks employing synapses embodying the disclosure as illustrated schematically in FIG. 12. This shows an optical synapse 80 integrated in a waveguide 81 for transmitting optical input signals from a pre-synaptic node $n_i$ to a post-synaptic $n_j$ of a neuromorphic network. Synapse 80 can be implemented generally as described above. However, the control circuitry for synapse 80 includes synapse control logic indicated at 82 in the figure. A first opto-electrical detector $D_{pre}$ is optically coupled to waveguide 81 to detect input signals from pre-synaptic node $n_i$. A second opto-electrical detector $D_{post}$ is optically coupled to a waveguide 83 transmitting optical output signals from post-synaptic node $n_j$. Detectors $D_{pre}$ and $D_{post}$ may be implemented, for example, by photodiodes which relay electrical signals to control logic 82 in response to optical signals in waveguides 81 and 83. Control logic 82 is responsive to these synaptic control signals from detectors $D_{pre}$, $D_{post}$ to vary control circuitry operation in synapse 80. In particular, control logic 82 can be adapted to vary the electrical drive signals supplied to the optical modulator in the read mode to implement a desired short-term plasticity effect. Variation of $V_{drive}$ or $I_{drive}$ may be achieved, for example, by adjusting the read bias $V_R$, or by implementing a resistor $R_2$, $R_3$ or $R_4$ as a variable resistor and dynamically adjusting the resistance value. In this way, the volatile optical modulator can be controlled to implement a desired STP effect. Such an effect may in general depend on synaptic control signals from one or both of detectors $D_{pre}$, $D_{post}$. For example, the STP effect of FIG. 11B may be implemented in dependence on synaptic control signals from detector $D_{pre}$.

Synapse control logic 82 can also be adapted to vary programming signals supplied to the optical modulator in the write mode in dependence on synaptic control signals from the detectors. Here, control logic 82 can vary the programming signals to implement a desired long-term plasticity effect. Programming signals can be varied by controlling one or a combination of the number, amplitude and duration of pulses $V_W$ supplied to memristive device in the write mode, thereby varying the long-term synaptic weight w. Again, such an LTP effect may in general depend on synaptic control signals from one or both of detectors $D_{pre}$, $D_{post}$. For example, the LTP effect of FIG. 11A may be implemented based on relative timing of synaptic control signals from both detectors.

Synapse control logic 82 may be implemented, in general, by hardware or software or a combination thereof and suitable implementations will be apparent to those skilled in the art. By dynamically adjusting operation in this way, the non-volatile weighting and volatile optical modulation in synapse 80 can be independently tuned to implement desired long- and short-term synaptic dynamics.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An optical synapse comprising:
    a memristive device for non-volatile storage of a synaptic weight dependent on resistance of the device; and
    an optical modulator for volatile modulation of optical transmission in a waveguide; and
    the memristive device and optical modulator being connected in control circuitry which is operable, in a write mode, to supply a programming signal to the memristive device to program the synaptic weight and, in a read mode, to supply an electrical signal, dependent on the synaptic weight, to the optical modulator whereby the optical transmission is controlled in a volatile manner in dependence on programmed synaptic weight.

2. The optical synapse of claim 1, wherein the control circuitry includes decoupling circuitry for electrically decoupling the optical modulator from the memristive device in the write mode.

3. The optical synapse of claim 1, wherein the memristive device is connected in a voltage divider and the electrical signal supplied to the optical modulator in the read mode is dependent on an output signal of the voltage divider.

4. The optical synapse of claim 1, wherein the memristive device and optical modulator are integrated in a monolithic integrated circuit.

5. The optical synapse of claim 1, wherein the optical modulator comprises an electro-optic modulator and the electrical signal comprises a drive voltage for the electro-optic modulator.

6. The optical synapse of claim 5, wherein the electro-optic modulator includes an optical phase shifter comprising a ferroelectric material, optically coupled to the waveguide, disposed between a pair of electrodes for applying the electrical signal, and wherein the control circuitry includes decoupling circuitry for electrically decoupling the optical modulator from the memristive device to inhibit ferroelectric domain switching in the ferroelectric material in the write mode.

7. The optical synapse of claim 6, wherein the ferroelectric material comprises one of barium titanate, lithium niobate, and lead zirconate titanate.

8. The optical synapse of claim 6, wherein the memristive device and optical modulator are integrated in a monolithic integrated circuit and the memristive device is formed on one of the electrodes.

9. The optical synapse of claim 6, wherein the memristive device and optical modulator are integrated in a monolithic integrated circuit and the memristive device is formed on a ferroelectric layer.

10. The optical synapse of claim 1, wherein the optical modulator comprises a thermo-optic modulator and the electrical signal comprises a drive current for a heater of the thermo-optic modulator.

11. The optical synapse of claim 10, wherein the thermo-optic modulator includes an optical phase shifter and the heater comprises a metal layer, in thermal contact with the waveguide, disposed between a pair of contacts for applying the electrical signal.

12. The optical synapse of claim 11, wherein the memristive device and optical modulator are integrated in a monolithic integrated circuit and the memristive device is formed on one of the contacts.

13. The optical synapse of claim 1, wherein the optical modulator comprises a Mach-Zehnder interferometer.

14. The optical synapse of claim 1, wherein the optical modulator comprises a plasmonic modulator.

15. The optical synapse of claim 1, wherein the control circuitry includes synapse control logic, responsive to synaptic control signals, which is operable to vary, in dependence on the synaptic control signals, electrical signals supplied to the optical modulator in the read mode to implement a desired short-term plasticity effect.

16. The optical synapse of claim 15, wherein:
the waveguide is arranged to transmit optical input signals from a pre-synaptic node to a post-synaptic node of a neuromorphic network in which the post-synaptic node transmits optical output signals in dependence on the optical input signals received thereby; and
the synaptic control signals are dependent on at least one selected from a group consisting of: the optical input signals, and the optical output signals.

17. The optical synapse of claim 15, wherein the synapse control logic is further operable to vary, in dependence on the synaptic control signals, programming signals supplied to the optical modulator in the write mode to implement a desired long-term plasticity effect.

18. The optical synapse of claim 17, wherein:
the waveguide is arranged to transmit optical input signals from a pre-synaptic node to a post-synaptic node of a neuromorphic network in which the post-synaptic node transmits optical output signals in dependence on the optical input signals received thereby; and
the synaptic control signals are dependent on at least one selected from a group consisting of: the optical input signals, and the optical output signals.

19. A neuromorphic network comprising a plurality of nodes in which pairs of nodes are interconnected via respective waveguides for transmission of optical signals between nodes of each pair, wherein each waveguide includes an optical synapse comprising:
a memristive device for non-volatile storage of a synaptic weight dependent on resistance of the device; and
an optical modulator for volatile modulation of optical transmission in the waveguide; and
the memristive device and optical modulator being connected in control circuitry which is operable, in a write mode, to supply a programming signal to the memristive device to program the synaptic weight and, in a read mode, to supply an electrical signal, dependent on the synaptic weight, to the optical modulator whereby the optical transmission is controlled in a volatile manner in dependence on programmed synaptic weight.

20. The neuromorphic network of claim 19, wherein the control circuitry of each synapse includes decoupling circuitry for electrically decoupling the optical modulator from the memristive device of the synapse in the write mode.

21. The neuromorphic network of claim 19, wherein the memristive device of each synapse is connected in a voltage divider and the electrical signal supplied to the optical modulator of the synapse in the read mode is dependent on an output signal of the voltage divider.

22. The neuromorphic network of claim 19, wherein the optical modulator of each synapse comprises an electro-optic modulator and the electrical signal comprises a drive voltage for the electro-optic modulator.

23. The neuromorphic network of claim 19, wherein the optical modulator of each synapse comprises a thermo-optic modulator and the electrical signal comprises a drive current for a heater of the thermo-optic modulator.

24. The neuromorphic network of claim 19, wherein the control circuitry of each synapse includes synapse control logic, responsive to synaptic control signals, which is operable to vary, in dependence on the synaptic control signals, electrical signals supplied to the optical modulator in the read mode to implement a desired short-term plasticity effect.

25. The neuromorphic network of claim 24, wherein the synapse control logic is further operable to vary, in dependence on the synaptic control signals, programming signals supplied to the optical modulator of the synapse in the write mode to implement a desired long-term plasticity effect.

* * * * *